United States Patent
Yoo et al.

(10) Patent No.: US 8,422,307 B2
(45) Date of Patent: Apr. 16, 2013

(54) NONVOLATILE MEMORY DEVICE AND READ METHOD USING DYNAMICALLY DETERMINED READ VOLTAGES

(75) Inventors: Han Woong Yoo, Seoul (KR); Seung-Hwan Song, Suwon-si (KR); Hee seok Eun, Hwaseong-si (KR); Jun jin Kong, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 394 days.

(21) Appl. No.: 12/797,668

(22) Filed: Jun. 10, 2010

(65) Prior Publication Data

US 2011/0007563 A1    Jan. 13, 2011

(30) Foreign Application Priority Data

Jul. 7, 2009  (KR) .................. 10-2009-0061741

(51) Int. Cl.
*G11C 16/04*  (2006.01)

(52) U.S. Cl.
USPC ............ 365/185.24; 365/185.03; 365/185.2

(58) Field of Classification Search ............ 365/185.03, 365/185.2, 185.24
See application file for complete search history.

(56) References Cited

U.S. PATENT DOCUMENTS

| | | |
|---|---|---|
| 6,952,365 B2 | 10/2005 | Gonzalez et al. |
| 7,177,195 B2 | 2/2007 | Gonzalez et al. |
| 2003/0137878 A1 | 7/2003 | Gonzalez et al. |
| 2003/0202403 A1 | 10/2003 | Gonzalez et al. |
| 2007/0133279 A1 | 6/2007 | Gonzalez et al. |
| 2007/0279982 A1 | 12/2007 | Shibata et al. |
| 2008/0094914 A1 | 4/2008 | Park et al. |
| 2008/0239805 A1 | 10/2008 | Shiga et al. |
| 2009/0282186 A1* | 11/2009 | Mokhlesi et al. ............. 711/103 |

FOREIGN PATENT DOCUMENTS

| | | |
|---|---|---|
| EP | 1 329 894 B1 | 6/2006 |
| ES | 2262946 T3 | 12/2006 |
| JP | 2004-005909 | 1/2004 |
| JP | 2007-323731 | 12/2007 |
| JP | 2008-084485 | 4/2008 |
| KR | 1020030063130 A | 7/2003 |
| KR | 10200700115755 A | 12/2007 |
| KR | 1020080029861 A | 4/2008 |
| KR | 1020080035828 A | 4/2008 |

* cited by examiner

*Primary Examiner* — Hoai V Ho
(74) *Attorney, Agent, or Firm* — Volentine & Whitt, PLLC

(57) ABSTRACT

A method of reading a nonvolatile memory device comprises measuring threshold voltage distributions of a plurality of memory cells, combining the measured threshold voltage distributions, and determining local minimum points in the combined threshold voltage distributions to determine read voltages for a predetermined group of memory cells.

16 Claims, 9 Drawing Sheets

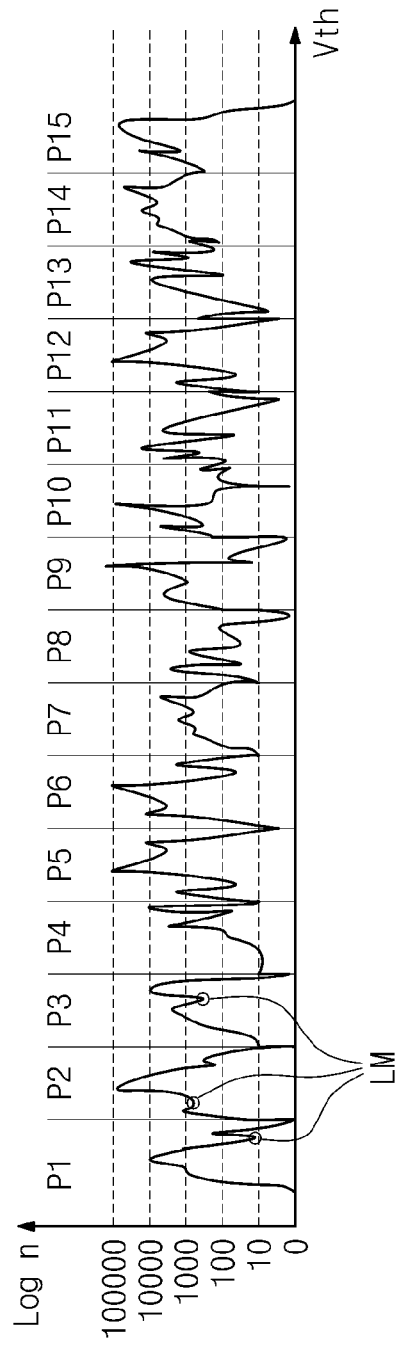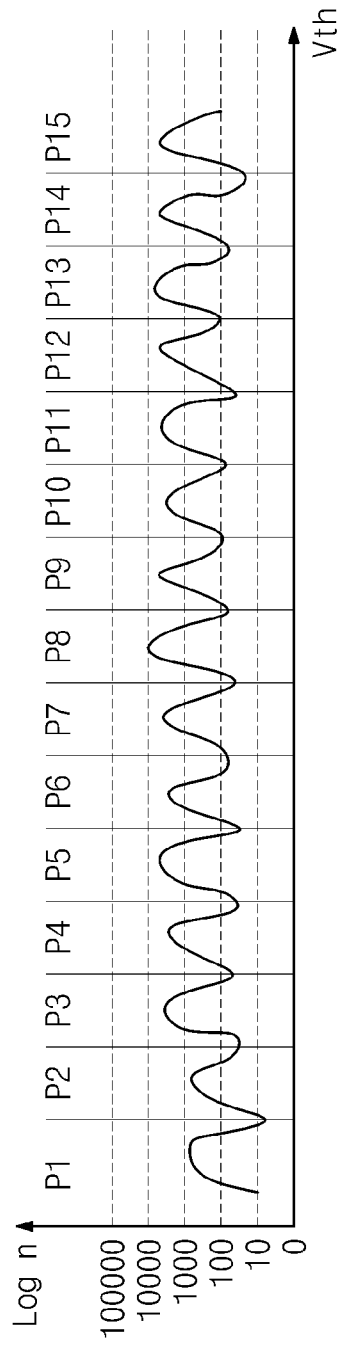

NONVOLATILE MEMORY DEVICE AND READ METHOD USING DYNAMICALLY DETERMINED READ VOLTAGES

CROSS-REFERENCE TO RELATED APPLICATIONS

This application claims priority under 35 U.S.C. §119 to Korean Patent Application No. 10-2009-0061741 filed on Jul. 7, 2009, the disclosure of which is hereby incorporated by reference in its entirety.

BACKGROUND

Embodiments of the inventive concept relate generally to semiconductor memory devices. More particularly, embodiments of the inventive concept relate to nonvolatile semiconductor memory devices and related methods of operation.

Semiconductor memory devices can be roughly divided into two categories based on whether they retain stored data when disconnected from power. These categories include volatile memory devices, which lose stored data when disconnected from power, and nonvolatile memory devices, which retain stored data when disconnected from power. Because nonvolatile memory devices retain stored data when disconnected from power, they are often used to store data that must be retained even when devices are powered down.

Examples of volatile memory devices include dynamic random access memory (DRAM) and static random access memory (SRAM). Examples of nonvolatile memory devices include electrically erasable programmable read only memory (EEPROM), ferroelectric random access memory (FRAM), phase-change random access memory (PRAM), magnetoresistive random access memory (MRAM), and flash memory.

In recent years, there has been an increase in the number of devices employing nonvolatile memory devices. As examples, nonvolatile memory devices are now used increasingly in MP3 players, digital cameras, cellular phones, camcorders, flash cards, solid state drives (SSDs), to name but a few. In addition, there has also been an increase in the overall storage capacity of nonvolatile memory devices, resulting in a tremendous amount of nonvolatile data storage in use today.

Flash memory is among the more frequently adopted forms of nonvolatile memory. It can be found in a wide variety of devices, including standalone applications such as memory cards, portable devices such as netbook computers, home electronics such as televisions, and others.

Most flash memories have one of two configurations, including NOR-type flash memory and NAND-type flash memory. In NOR-type flash memory, two or more cell transistors are connected in parallel to a single bitline, and data is stored using channel hot electron and erased data using Fowler-Nordheim tunneling. In NAND-type flash memory, two or more cell transistors are connected in series to a single bitline, and data is both stored and erased using Fowler-Nordheim tunneling.

Memory cells in a flash memory typically store one or more bits of data each. A flash memory cell capable of storing one bit of data typically has two threshold voltage states—one state representing a logical "1" and another state representing a logical "0". A flash memory cell capable of storing two bits of data generally has four threshold voltage states representing logical "11", "10", "00", and "01". Similarly, a flash memory cell capable of storing three bits of data typically has eight threshold voltage states representing logical "111", "110", etc. Moreover, various techniques are currently being pursued to store four or more bits of data per memory cell.

SUMMARY

Selected embodiments of the inventive concept provide nonvolatile memory devices and methods for performing read operations in the nonvolatile memory devices. Some of these embodiments can enhance the reliability of the read operations.

According to one embodiment of the inventive concept, a method of operating a nonvolatile memory device comprises measuring a plurality of threshold voltage distributions of a plurality of memory cells, combining the plurality of threshold voltage distributions to form a collective threshold voltage distribution, identifying local minimum points in the collective threshold voltage distribution, and identifying read voltages for a predetermined group of memory cells based on the identified local minimum points.

In certain embodiments, the plurality of threshold voltage distributions are measured by performing a plurality of measurement read operations on a single group of memory cells.

In certain embodiments, the plurality of measurement read operations are performed in successive intervals.

In certain embodiments, some of the plurality of threshold voltage distributions are stored in a distribution information accumulator and accessed to calculate the collective threshold voltage distribution.

In certain embodiments, combining the plurality of threshold voltage distributions comprises calculating a sum of the plurality of threshold voltage distributions.

In certain embodiments, combining the plurality of threshold voltage distributions further comprises scaling the sum. In certain embodiments, scaling the sum comprises dividing the sum by the number of the plurality of threshold voltage distributions. In certain embodiments, the sum is a weighted sum.

In certain embodiments, the predetermined group of memory cells is connected to a first wordline and the plurality of memory cells are connected to a plurality of second wordlines not including the first wordline.

In certain embodiments, the method further comprises reading the predetermined group of memory cells using the read voltages.

In certain embodiments, the nonvolatile memory device is a flash memory device.

In certain embodiments, the flash memory device comprises memory cells storing four bits per cell.

According to another embodiment of the inventive concept, memory system comprises a nonvolatile memory device comprising a plurality of memory cells, and a memory controller. The memory controller measures a plurality of threshold voltage distributions of a first group of memory cells among the plurality of memory cells, combines the plurality of threshold voltage distribution to generate a collective threshold voltage distribution, detects local minimum points in the collective threshold voltage distribution, and identifies read voltages for a second group of memory cells based on the local minimum points.

In certain embodiments, the memory controller comprises a distribution information accumulator that stores the plurality of threshold voltage distributions.

In certain embodiments, the second group of memory cells is a subset of the first group of memory cells.

In certain embodiments, the memory controller comprises a filter that combines the plurality of threshold voltage distributions.

In certain embodiments, the filter is a finite impulse response filter that combines the plurality of threshold voltage distributions using a weighted sum.

According to still another embodiment of the inventive concept, a method of determining a read voltage for a nonvolatile memory device comprises measuring a plurality of threshold voltage distributions corresponding to memory cells in the nonvolatile memory device, and combining the plurality of threshold voltage distributions to generate a plurality of local minima indicating values of read voltages of a predetermined group of memory cells in the nonvolatile memory device.

In certain embodiments, measuring the plurality of threshold voltage distributions comprises counting a number of the memory cells that have threshold voltages within each of a plurality of threshold voltage ranges.

In certain embodiments, combining the plurality of threshold voltage distributions comprises computing an average of the plurality of threshold voltage distributions.

BRIEF DESCRIPTION OF THE DRAWINGS

Embodiments of the inventive concept are described below with reference to the accompanying drawings. In the drawings, like reference numbers denote like features.

FIGS. 8A and 8B are graphs illustrating the use of distribution information to generate read voltages for a nonvolatile memory device according to an embodiment of the inventive concept.

DETAILED DESCRIPTION OF THE EMBODIMENTS

Selected embodiments of the inventive concept are described below with reference to the accompanying drawings. These embodiments are presented as teaching examples and should not be construed to limit the scope of the inventive concept as defined by the claims.

In the description that follows, a NAND-type flash memory device is used as a teaching example to illustrate various aspects of the inventive concept. The inventive concept, however, is not limited to NAND-type flash memory devices and could be embodied by other types of nonvolatile memories, including other forms of flash memory.

Figure 1:
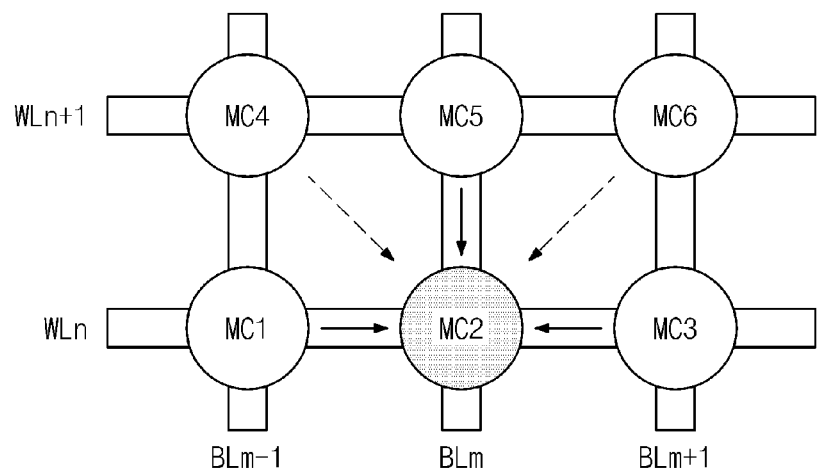
FIG. 1 is a schematic diagram illustrating a memory cell array of a nonvolatile memory device according to an embodiment of the inventive concept.

FIG. 1 is a schematic diagram illustrating a memory cell array of a nonvolatile memory device according to an embodiment of the inventive concept.

Referring to FIG. 1, the memory cell array comprises memory cells MC1 through MC6 arranged in rows connected to respective wordlines WLn+1 and WLn, and columns connected to respective bitlines BLm−1, BLm and BLm+1.

During program or write operations of memory cells MC1 through MC6, electrical interference can occur between memory cells that are located close together or connected to common components. For instance, in the example shown in FIG. 1, memory cell MC2 experiences interference due to the programming of memory cells MC1 and MC3 through MC6, as indicated by arrows. Such interference can be caused, for instance, by program disturbances or electrical coupling.

Memory cells that cause interference are referred to as aggressor cells and memory cells that experience interference will be referred to as victim cells or sacrificial cells. The interference typically affects the sacrificial cell by modifying its threshold voltage, which can cause the sacrificial cell to produce erroneous results when a read operation is performed.

In addition to program disturbances or electrical coupling, other factors can also cause unintentional changes to the threshold voltage of a sacrificial cell. For example, the threshold voltage of a sacrificial cell can be changed by the passage of time, high temperature stress, and deterioration of an oxide layer due to an elevated number of program/erase (P/E) cycles. The threshold voltage of a sacrificial cell can also be deteriorated due to phenomena such as lateral charge spreading due to the configuration of memory device elements such as floating gates in charge trap flash (CTF) memory devices. Additionally, sacrificial cells are not limited to interference from nearby memory cells as illustrated in FIG. 1, but can also receive interference from memory cells connected to common components, such as other memory cells connected to the same wordline or bitline. Sacrificial cells can also be affected by patterns of stored data and methods of recording data.

In addition to modifying the threshold voltages of individual sacrificial cells, interference can also alter the threshold voltage distributions of a collection of memory cells. For instance, the interference can cause a threshold voltage distribution to be shifted or diffused during programming or reading of data. Because the threshold voltage distributions can change due to a variety of factors, it can be advantageous to use a flexible read voltage (or voltages) to perform read operations in nonvolatile memory devices. The use of a flexible read voltage can be particularly beneficial in multi-level cells having relatively small margins between adjacent threshold voltage distributions.

The value or magnitude of the flexible read voltage can be determined by a calibration operation involving the measurement of threshold voltages of a set of programmed memory cells storing a known data set. In other words, the value of the flexible read voltage can be determined by programming the memory cells with a known data set and then examining the threshold voltage distribution of the memory cells to determine read voltages required to accurately read the data set. The determined read voltages can then be applied in subsequent read operations to account for potential interference in the memory cells being read.

In multi-level cells, especially those storing four or more bits of data, there can be significant challenges to accurately determining the value of the flexible read voltage. Among the challenges is noise flowing into memory cells during measurements of read voltages. Such noise can comprise, for instance, thermal noise and random telegraph signal (RTS) noise. Noise can have an especially significant impact on the determination of local minima in threshold voltage distributions because the relative impact of noise tends to be greater on smaller measurements.

Figure 2:
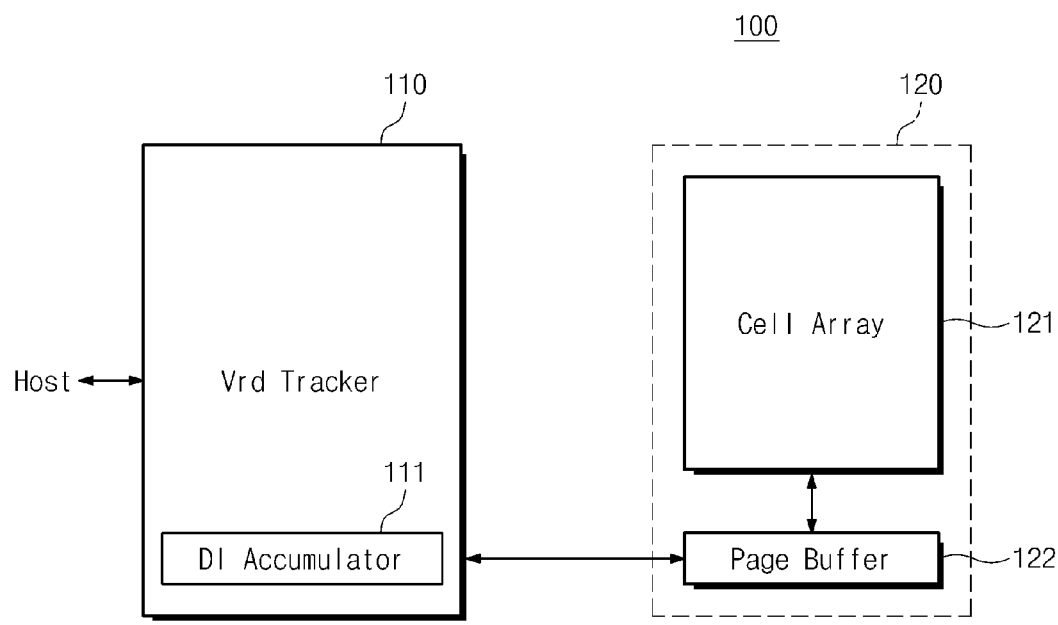
FIG. 2 is a block diagram illustrating a memory system comprising a nonvolatile memory device according to an embodiment of the inventive concept.

FIG. 2 is a block diagram illustrating a memory system comprising a nonvolatile memory device according to an embodiment of the inventive concept.

Referring to FIG. 2, a memory system 100 comprises a nonvolatile memory device 120 and a read voltage determining unit 110.

Read voltage determining unit 110 controls a measurement read operation to determine a read voltage to be used in subsequent read operations of memory system 100.

In the measurement read operation, read voltage determining unit 110 receives a command from a host to select a set of memory cells. Read voltage determining unit 110 then controls nonvolatile memory device 120 to read the selected memory cells several times using different measurement read voltages as described below with reference to FIG. 3, and determines the read voltage based on threshold voltage distributions obtained by applying the different measurement read voltages to the selected memory cells.

Where there is a clear separation between different threshold voltage distributions obtained with the measurement read voltages, the read voltage can be chosen as a voltage within the separation. In other words, the read voltage can be chosen with a value that allows the adjacent threshold voltage distributions to be readily distinguished from each other. One way to identify the separation between adjacent threshold voltage distributions is to locate a local minimum between the threshold voltage distributions, as will be described with reference to FIG. 3.

In determining the read voltage, read voltage determining unit 110 is not limited to using information from threshold voltage distributions of the selected memory cells, but can also use information from threshold voltage distributions of memory cells located adjacent to the selected memory cells. Accordingly, in the measurement read operation, read voltage determining unit 110 can control nonvolatile memory device 120 to read memory cells that have been selected by the host, and also memory cells that have not been selected by the host. Threshold voltage distributions of both the selected and unselected memory cells can then be used to determine the read voltage.

In the embodiment of FIG. 2, read voltage determining unit 110 comprises a distribution information accumulator 111 that stores threshold voltage information collected from selected and/or unselected memory cells during measurement read operations.

In certain embodiments, read voltage determining unit 110 is incorporated in a memory controller forming an interface between nonvolatile memory device 120 and the host. Such a memory controller can be used to control nonvolatile memory device 120 to read or write data in nonvolatile memory device 120 in response to read/write requests from the host. Such a memory controller can be implemented in hardware, software (e.g., firmware), or a combination of hardware and software. The location of read voltage determining unit 110, however, is not limited to that illustrated in FIG. 2.

Nonvolatile memory device 120 comprises a cell array 121 and a page buffer 122. Nonvolatile memory device 120 reads data stored in selected memory cells and unselected memory cells within cell array 121 under the control of read voltage determining unit 110 and using a read voltage determined by read voltage determining unit 110. Page buffer 122 stores a unit of data, such as a page, that has been read from cell array 121 in a read operation. The data stored in page buffer 122 can be transferred to read voltage determining unit 110.

After a read voltage has been selected through a measurement read operation performed under the control of read voltage determining unit 110, nonvolatile memory device 120 performs read operations using the selected read voltage.

Figure 3:
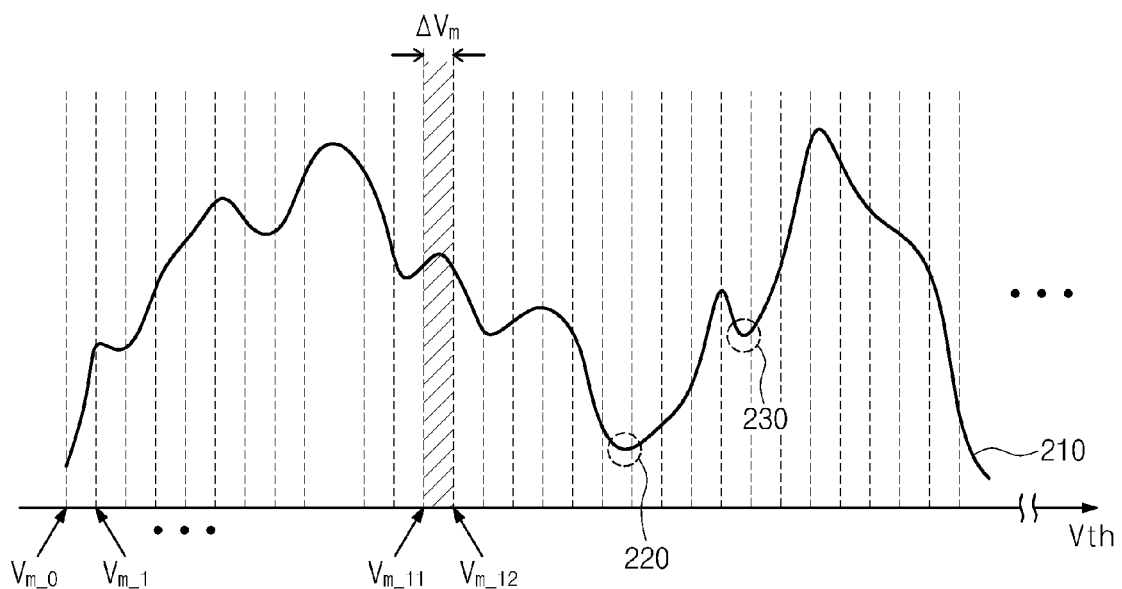
FIG. 3 is a graph illustrating a method of performing a measurement read operation in a nonvolatile memory device according to an embodiment of the inventive concept.

FIG. 3 is a graph illustrating a method of performing a measurement read operation in a nonvolatile memory device according to an embodiment of the inventive concept. In this embodiment, the measurement read operation is performed under the control of read voltage determining unit 110 of FIG. 2.

In the graph of FIG. 3, the x-axis indicates values of different measurement read voltages Vm_x applied to the selected memory cells in a measurement read operation, and the y-axis indicates the number of memory cells having threshold voltages within various ranges defined by pairs of adjacent measurement read voltages Vm_x. A curve 210 in FIG. 3 shows a distribution of threshold voltages across a wide range of values. Within curve 210 there are regions comprising local maxima and local minima that can be assigned to distinct program states of programmed memory cells. For instance, a region comprising a local maximum and two flanking local minima can be assigned to a program state representing four bits "1010". Although such regions form part of a larger threshold voltage distribution, the regions will also be referred to as threshold voltage distributions, and such regions that are adjacent to each other will be referred to as adjacent threshold voltage distributions.

As indicated by a shaded area in FIG. 3, each pair of adjacent measurement read voltages differs by a voltage step ΔVm. For instance, the shaded area separates measurement read voltages Vm_11 and Vm_12, where measurement read voltage Vm_11 is less than measurement read voltage Vm_12 by voltage step ΔVm.

The measurement read operation determines the number of selected memory cells having a threshold voltage within each pair of adjacent measurement read voltages by detecting selected memory cells that are turned on in the presence of a lower one of the pair of voltages and then detecting selected memory cells that are turned off in the presence of an upper one of the pair of voltages. Selected memory cells that are turned on in response to the lower voltage and turned off in response to the upper voltage are determined to have threshold voltages within the range between the lower and upper measurement read voltages.

The measurement read voltages are typically provided in a sequence during the measurement read operations. The sequence can begin with a lowest measurement read voltage Vm_0 and increase by voltage step ΔVm toward a highest measurement read voltage. During measurement read operations, local minimum points can also be detected to determine separations between adjacent threshold voltage distributions. In the example of FIG. 3, two local minimum points 220 and 230 are labeled.

The size of a voltage step ΔVm can be modified in consideration of a tradeoff between the time required for the measurement read operation and precision. A larger voltage step ΔVm generally results in a relatively faster, but less precise measurement read operation, and a smaller voltage step ΔVm generally results in a relatively slower, but more precise measurement read operation. In addition, various alternative counting methods can be used to determine the number of memory cells between adjacent measurement read voltages Vm_n and Vm_n+1.

Figure 4:
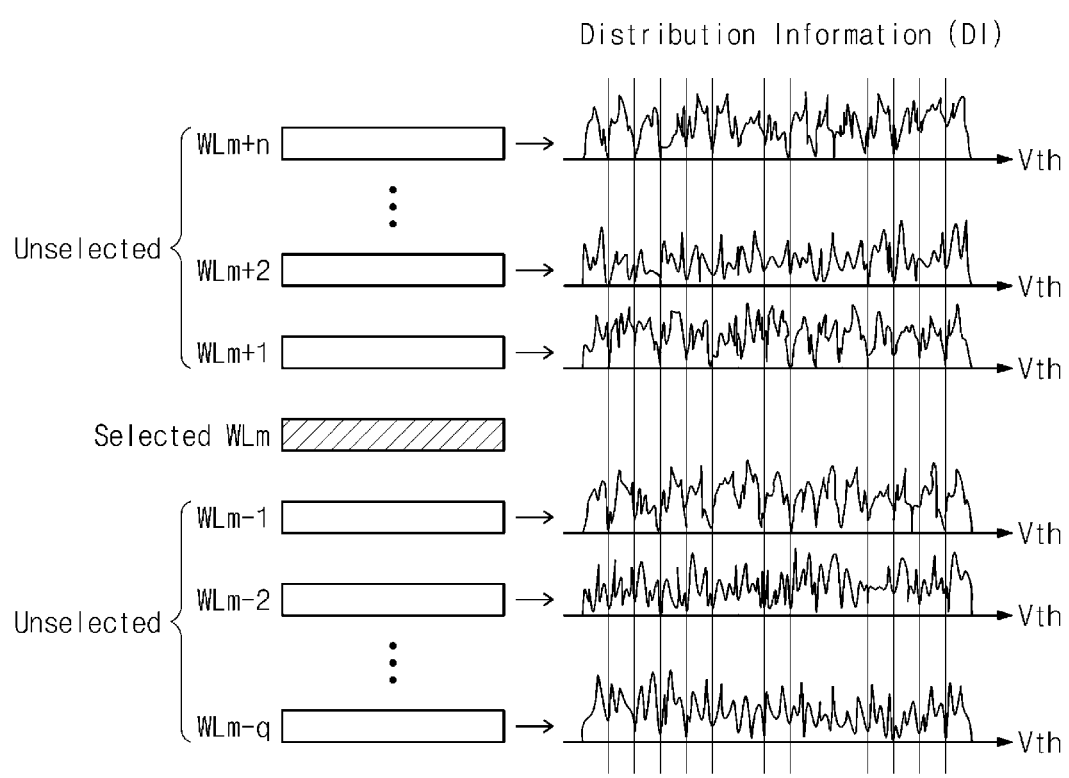
FIG. 4 is a diagram illustrating a method of performing a measurement read operation in a nonvolatile memory device according to an embodiment of the inventive concept.

FIG. 4 is a diagram illustrating a method of performing a measurement read operation in a nonvolatile memory device according to an embodiment of the inventive concept. In this embodiment, the method is performed by an embodiment of memory system 100 of FIG. 2.

Referring to FIG. 4, read voltage determining unit 110 performs a measurement read operation on unselected memory cells located around the selected memory cells to determine a read voltage.

When performing a measurement read operation on memory cells connected to any one wordline, an excessive number of local minima can be identified in a threshold voltage distribution. The local minima can be caused by a variety of factors, including random noise, such as the thermal noise or RTS noise described above.

Due to the excessive number of local minima, it can be difficult to accurately determine a read voltage based on a single threshold voltage distribution. As an example, as illustrated in FIG. 4, many local minimum points are included in the threshold voltage distributions of unselected memory cells connected to wordlines WL<m−1> through WL<m−q> and WL<m+1> through WL<m+n>. The number of local minimum points is greater than the number of read voltages to be used in read operations of the selected memory cells, as indicated by the number of vertical lines in FIG. 4 (which represent read voltages) compared with the number of local minima in each of the threshold voltage distributions. Accordingly, it is not possible to assign a separate read voltage to each local minimum.

To reduce the number of local minima, the threshold voltage distributions can be reprocessed using analytical techniques that combine information from other threshold voltage distributions. For instance, in the example of FIG. 4, the threshold voltage distributions of memory cells connected to unselected wordlines WL<m−1> through WL<m−q> and WL<m+1> through WL<m+n> can be analyzed together to determine which local minima should correspond to read voltages.

As indicated by the vertical lines in FIG. 4, multiple threshold voltage distributions can have local minima at the same threshold voltage levels. This phenomenon can be used to distinguish spurious local minima, such as those caused by noise, from local minima corresponding to read voltages. One technique for combining information from multiple threshold voltage distributions is to sum the threshold voltage distributions. Such a sum can also be computed as a weighted sum based on the locations of the unselected wordlines that correspond to each of the threshold voltage distributions. For instance, threshold voltages distributions that correspond to unselected wordlines located close to selected wordline WLm can be given greater weight than those located further from selected wordline WLm.

Once a set of local minima has been identified from the threshold voltage distributions corresponding to the unselected wordlines, the set of local minima can be used to generate read voltages for memory cells connected to selected wordline WLm. For instance, the read voltages of the memory cells connected to the selected wordline can be chosen to correspond with the set of local minima.

Figure 5:
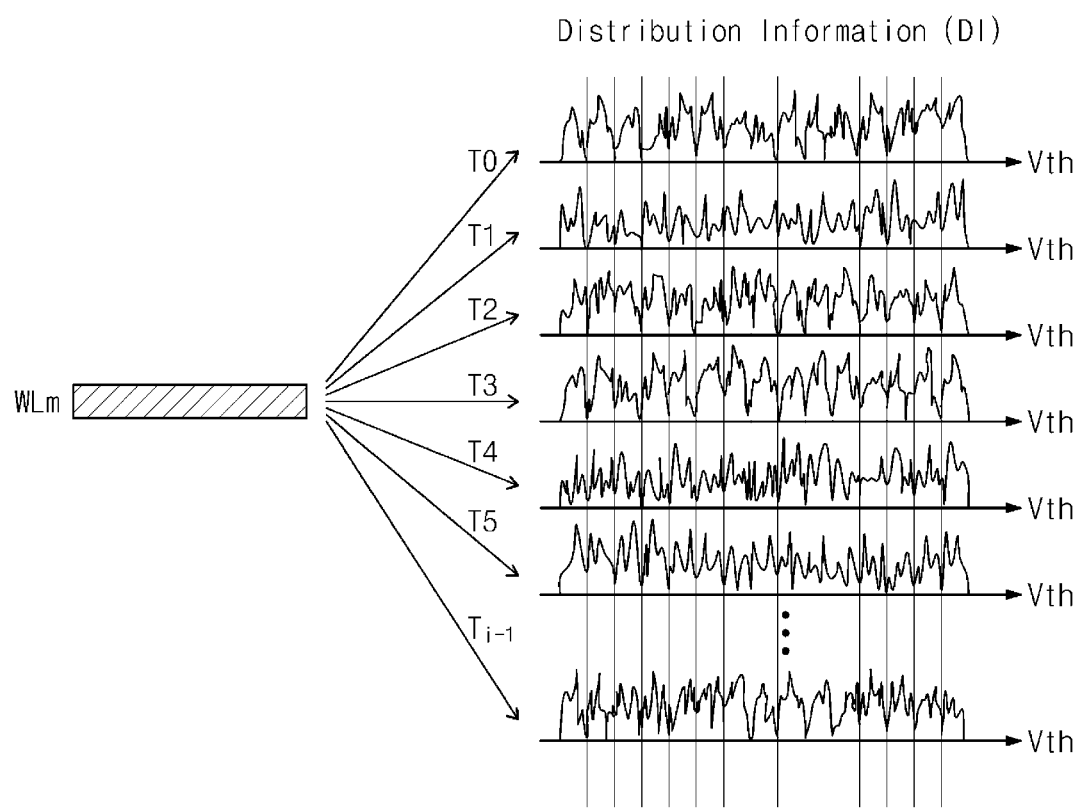
FIG. 5 is a diagram illustrating a method of performing a measurement read operation in a nonvolatile memory device according to another embodiment of the inventive concept.

FIG. 5 is a diagram illustrating a method of performing a read operation in a nonvolatile memory device according to another embodiment of the inventive concept. In the description of this embodiment it is assumed that the method is performed by an embodiment of memory system 100 of FIG. 2.

Referring to FIG. 5, read voltage determining unit 110 determines a read voltage by performing repeated measurement read operations on memory cells connected to a selected wordline WLm. The repeated operations are performed at different times T0 through Ti−1 to generate "i" threshold voltage distributions. The "i" threshold voltage distributions are then analyzed in combination, e.g., by summing, to derive a read voltage or read voltages for performing subsequent read operations on the memory cells.

By combining multiple threshold voltage distributions, the impact of noise can be reduced because the noise tends produce local minima at different points in different distributions. In certain embodiments, for instance, the multiple threshold voltage distributions are summed to produce a cumulative threshold voltage distribution. In the cumulative threshold voltage distribution, local minima that occur in several of the threshold voltage distributions tend to be magnified more than those that occur in only one of the threshold voltage distributions. Accordingly, a combination of the multiple threshold voltage distributions, e.g., in the form of a sum, can be useful for determining read voltages.

As an alternative to performing the repeated measurement read operations illustrated in FIG. 5, data can be collected from multiple measurement read operations performed in the past. In other words, rather than generating a new set of threshold voltage distributions as in FIG. 5, stored threshold voltage distributions can be used to determine the read voltages. In certain embodiments, the stored distributions can be maintained in distribution information accumulator 111. Where the read voltages are determined using stored information, the time required to determine the read voltages can be reduced.

Figure 6:
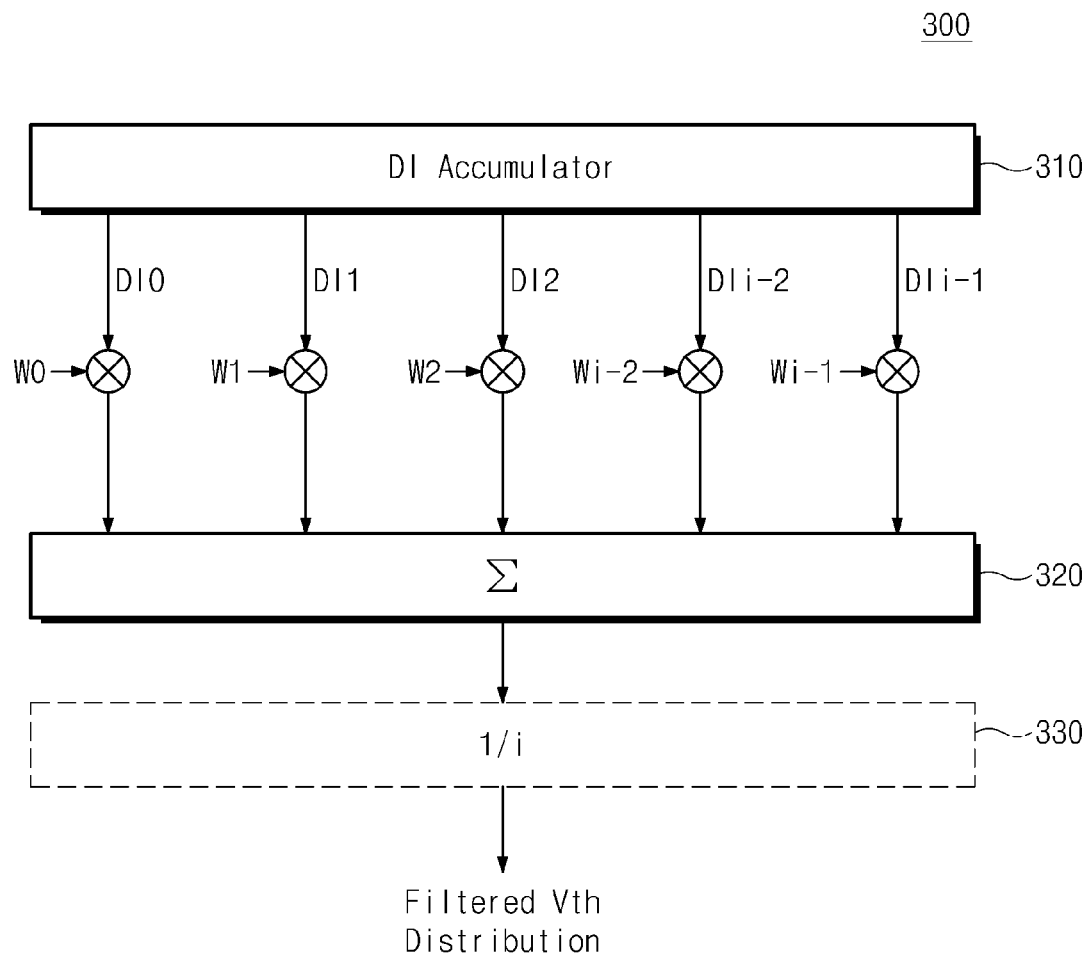
FIG. 6 is a schematic diagram illustrating a read voltage determining unit used to determine a read voltage for a nonvolatile memory device according to an embodiment of the inventive concept.

FIG. 6 is a schematic diagram illustrating a read voltage determining unit used to determine a read voltage for a nonvolatile memory device according to an embodiment of the inventive concept. More specifically, FIG. 6 illustrates a read voltage determining unit 300 comprising a finite impulse response (FIR) filter for determining a read voltage based on distribution information (DI) obtained through measurement read operations.

In FIG. 6, it will be assumed that distribution information DI0 through DIi−1 corresponds to the threshold voltage distributions obtained through the measurement read operations of FIG. 4 or FIG. 5. In other words, distribution information DI0 through DIi−1 can comprise threshold voltage distributions collected from memory cells connected to unselected wordlines, or threshold voltage distributions collected at different times from memory cells connected to a selected wordline.

Distribution information DI0 through DIi−1 is stored in a distribution information accumulator 310. The stored distribution information is output to a weighting unit that multiplies distribution information DI0 through DIi−1 by respective weights W0 through Wi−1. The weighted distribution information is received and summed by an adder 320. The summed distribution information is then scaled by a factor of 1/i in an averaging unit 330 and then output from read voltage determining unit 300.

In some embodiments, the weights are set to one so that each unit of distribution information DI0 through DIi−1 is weighted equally. In other embodiments, the weights are set to different values in consideration of various forms of interference such as coupling, program disturbances, and territorial doping imbalances. In certain embodiments using the method of FIG. 4, greater weight can be given to distribution information related to wordlines adjacent to a selected wordline by the host. In certain embodiments using the method of FIG. 5, greater weight can be given to distribution information collected most recently.

In some embodiments, local minima are identified in the output of adder 320 without requiring any operations by averaging unit 330, and in other embodiments the local minima are identified after the operations performed by averaging unit 330. The data output by adder 320 or averaging unit 330 typically allows the local minima to be identified without further processing from other elements.

Where a local minimum is identified within a particular range of threshold voltages, such as a range between threshold voltages Vm_11 and Vm_12, a threshold voltage at the local minimum is designated as a read voltage for the range. In various embodiments, the local minimum point can be located on either side of the range, such as at threshold voltage Vm_11 or Vm_12, or it can be located in the middle of the range.

In some embodiments, a number of read voltages are determined using a number of local minima. For instance, in some embodiments, read voltage determining unit 110 determines one or more read voltages from some local minima and then uses those read voltages as a basis for assigning other read voltages.

Although the embodiment of FIG. 6 uses a FIR filter to assign read voltages, other embodiments can use different types of filters, such as an infinite impulse response (IIR) filter or a combination of a FIR filter and an IIR filter.

Figure 7:
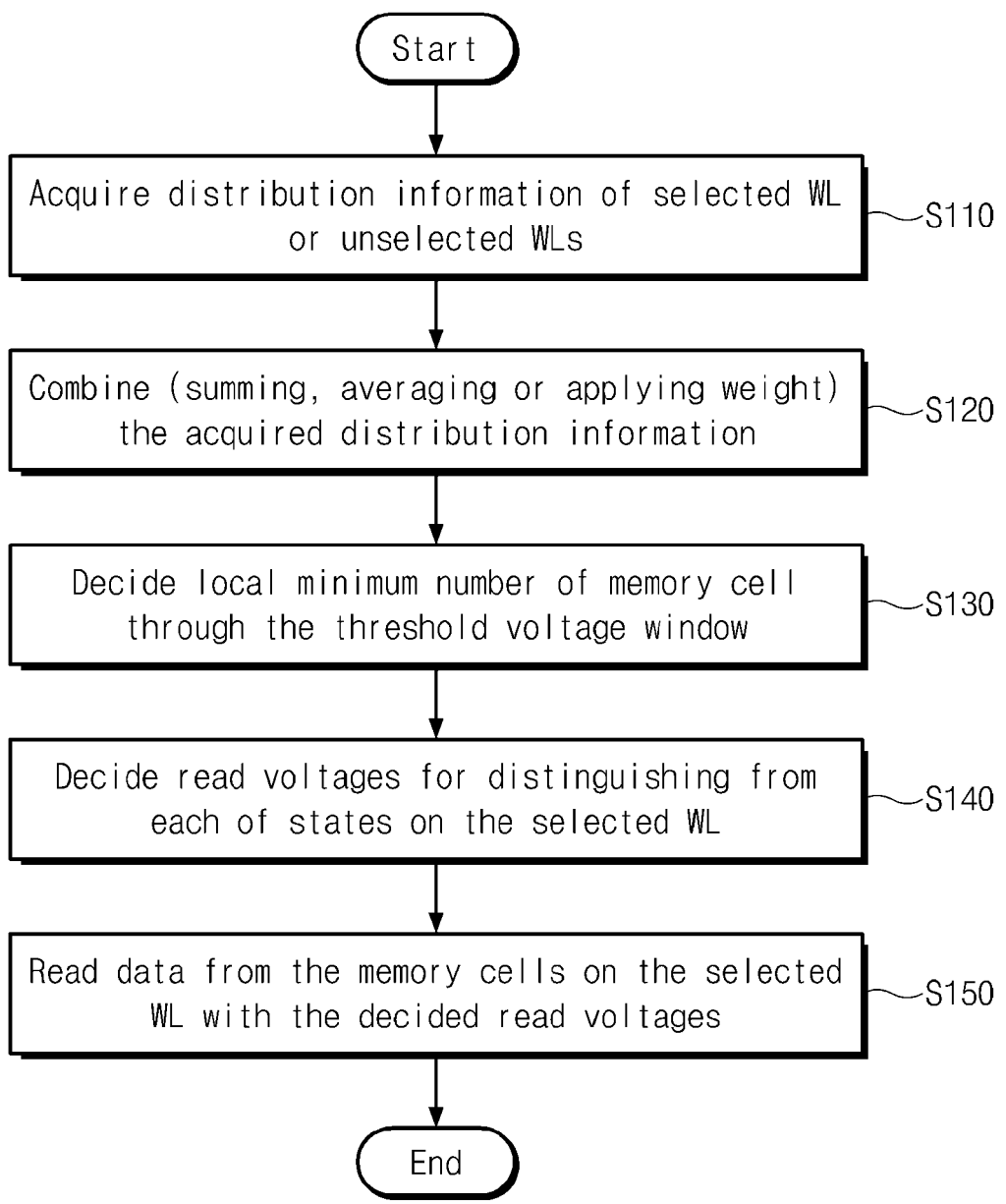
FIG. 7 is a flowchart illustrating a method of determining a read voltage for a nonvolatile memory device according to an embodiment of the inventive concept.

FIG. 7 is a flowchart illustrating a method of determining a read voltage for a nonvolatile memory device according to an embodiment of the inventive concept. More specifically, FIG. 7 illustrates a measurement read operation performed by read voltage determining unit 110 and a method of determining a read voltage from a result of the measurement read operation.

In the method of FIG. 7, read voltage determining unit 110 first acquires distribution information for a set of memory cells (S110). The distribution information can be acquired, for instance, using the method of FIG. 4 or the method of FIG. 5. In addition, the distribution can be acquired in discrete intervals such as those illustrated in FIG. 3. In certain embodiments, distribution information for a single interval is acquired and analyzed for each of several rows of memory cells before distribution information is acquired for other rows. The acquired distribution is analyzed in subsequent operations using methods such as those described with reference to FIGS. 4 through 6.

After the distribution information is acquired, it is combined using a filter such as that of FIG. 6 (S120). The combination can involve, for instance, a sum and average, a weighted sum, and so forth. After the distribution information has been combined, local minima are detected in the combined information (S130). The local minima can generally be identified more readily in the combined information than in uncombined information due to the presence of noise, as explained above. Once local minimum points over the whole threshold voltage window are determined, a read voltage for reading a selected wordline or a selected page is determined (S140). Following identification of the read voltages, a read operation is performed on the selected memory cells, which typically comprises a selected page connected to a selected wordline (S150).

By combining the distribution information as described above, excess local minima can be eliminated or suppressed from the combined distribution information. This elimination of local minima can be explained, at least in part, by probability theory as described below.

Using probability theory, a program state of memory cells can be modeled as a random variable with a read voltage defined by the following equation (1).

$$V_{read} = V_{th} + v \quad (1)$$

In equation (1), voltage Vread is a measurement read voltage used in a measurement read operation. Voltage Vth is a random variable representing a unique threshold voltage that corresponds to a program state of a programmed memory cell. Variable "v" is a random variable representing a magnitude of random noise. Variable "v" comprises is measured with different values according to a time or spatial location where voltage Vread is applied. Although variable "v" may include a bias value, it will be assumed for convenience of calculation that v is independently and identically distributed (IID) with a mean of zero.

Where a plurality of measurement read operations are performed at different times or on different groups of memory cells, the combined results of those operations can be modeled by the following equation (2).

$$V_{read,avg} = \frac{\sum_{i=1}^{n} V_{read,i}}{n} = V_{th} + \frac{1}{n}\sum_{i=1}^{n} v_i \quad (2)$$

In equation (2), "n" represents a number measurement read operations that are performed. In other words, "n" is similar to the variable "i" in FIG. 6. As illustrated in equation (2), the effect of random noise is "n". If view of the central limit theorem, as the value of "n" increases, the distribution of random noise has a shape similar to a normal distribution like the following equation (3).

$$V_{read,avg}\left(N\left(V_{th}, \frac{\sigma^2}{n}\right)\right) \quad (3)$$

FIGS. 8A and 8B are graphs illustrating the use of distribution information to generate read voltages for a nonvolatile memory device according to an embodiment of the inventive concept. In particular, FIG. 8A illustrates a threshold voltage distribution obtained from a measurement read operation, and FIG. 8B illustrates a threshold voltage distribution generated through additional processing after a plurality of measurement read operations.

Referring to FIG. 8A, a threshold voltage distribution is illustrated with overlaid threshold voltage windows corresponding to program states P1 through P15. Read voltages are to be selected to distinguish between program states P1 through P15. The selection of the read voltages, however, is complicated by the existence of excess local minimum points LM in the threshold voltage distribution of FIG. 8A. Accordingly, read voltage determining unit 110 removes unnecessary local minimum points LM from the threshold voltage distribution to achieve a threshold voltage distribution shown in FIG. 8B.

The threshold voltage distribution of FIG. 8B can be achieved, for instance by a filtering operation such as that illustrated in FIG. 6. In the threshold voltage distribution of FIG. 8B, read voltages can be readily identified at local minimum points.

Figure 9:
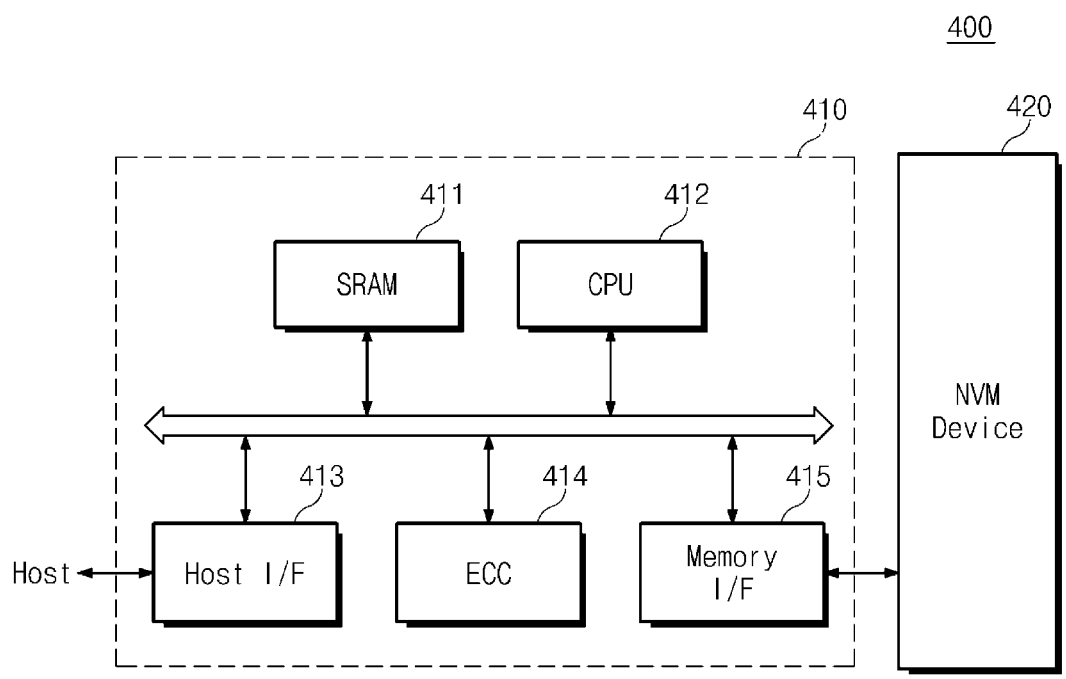
FIG. 9 is a block diagram illustrating a memory system according to another embodiment of the inventive concept.

FIG. 9 is a block diagram illustrating a memory system according to another embodiment of the inventive concept.

Referring to FIG. 9, a memory system 400 comprises a nonvolatile memory device 420 and a memory controller 410. Memory system 400 can be incorporated in any of several types of devices, such as, e.g., solid state drives or memory cards.

Nonvolatile memory device 420 provides data storage and typically comprises a flash memory device.

Memory controller 410 is configured to control nonvolatile memory device 420 and comprises an SRAM 411, a central processing unit 412, a host interface 413, an error correction block 414, and a memory interface 415. These features are connected to each other through a bus architecture.

SRAM 411 is used as a working memory of processing unit 412. Host interface 413 implements a data exchange protocol for communicating with a host connected to memory system 400. Error correction block 414 detects and corrects errors included in data read from nonvolatile memory device 420. Memory interface 415 interfaces with nonvolatile memory device 420. Processing unit 412 performs control operations for data exchange between memory controller 410 and other components.

In various alternative embodiments, memory system 400 can further comprise a ROM for storing code data used in host interface 413, nonvolatile memory device 420 can be implemented in a multi-chip package, and nonvolatile memory device 420 can use read measurement operations such as those described above to improve reliability and reduce the probability of errors. Memory controller 410 can be configured to communicate with external devices using any of various interface protocols, such as USB, MMC, PCI-E, SATA, PATA, SCSI, ESDI and IDE.

Figure 10:
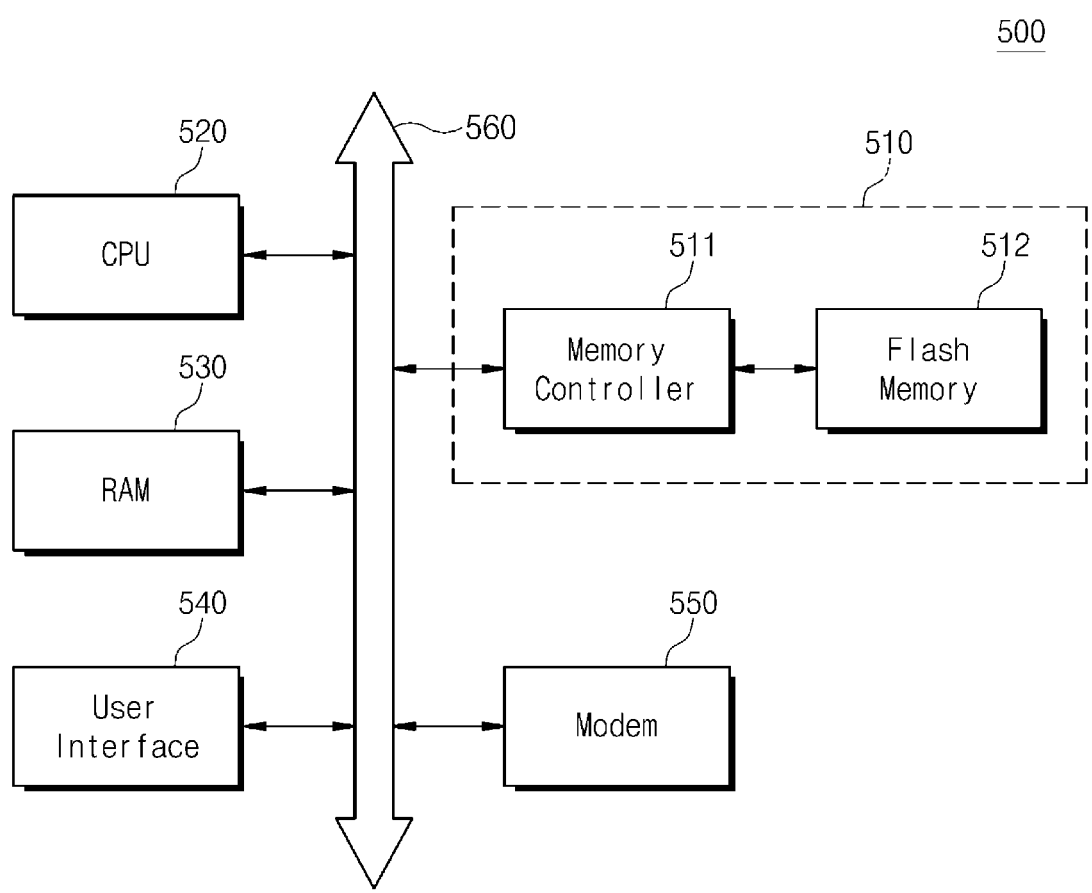
FIG. 10 is a block diagram illustrating a computing system comprising a memory system according to an embodiment of the inventive concept.

FIG. 10 is a block diagram illustrating a computing system according to an embodiment of the inventive concept. The computing system can incorporate a memory system such as those described above with reference to FIGS. 2 and 9.

Referring to FIG. 10, a computing system 500 comprises a microprocessor 520, a RAM 530, a user interface 540, a modem 550 such as a baseband chipset, and memory system 510 that are electrically connected to a system bus 560. Where computing system 500 is a mobile device, a battery (not illustrated) can be further provided to supply power to the other features.

Although not illustrated in the drawings, computing system 500 can further comprise an application chipset, a camera image processor (CIS), a mobile DRAM or various other features. In some embodiments, memory system 510 comprises a solid state drive using a nonvolatile memory device to store data. In certain embodiments, memory system 510 comprises a fusion flash memory, such as a OneNAND flash memory.

Various flash memory devices and/or memory controllers described above can be mounted in any of several types of packages or package configurations, such as package on package (PoP), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP) and wafer-level processed stack package (WSP).

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A method of operating a nonvolatile memory device including a plurality of memory cells arranged in respective connection with one of a plurality of word lines, comprising:
   identifying a selected word line from among the plurality of word lines, wherein word lines other than the selected word line are unselected word lines;
   measuring a plurality of threshold voltage distributions for memory cells respectively connected to at least one of the unselected word lines;
   combining the plurality of threshold voltage distributions to form a collective threshold voltage distribution;
   identifying local minimum points in the collective threshold voltage distribution; and
   identifying read voltages for selected memory cells respectively connected to the selected word line based on the identified local minimum points.

2. The method of claim 1, wherein the plurality of threshold voltage distributions are measured by performing a number of measurement read operations respectively directed to a group of memory cells connected to one of the at least one of the unselected word lines.

3. The method of claim 2, wherein at least one of the plurality of threshold voltage distributions is stored in a distribution information accumulator and is accessed to calculate the collective threshold voltage distribution.

4. The method of claim 1, wherein combining the plurality of threshold voltage distributions comprises calculating a sum of the plurality of threshold voltage distributions.

5. The method of claim 4, wherein combining the plurality of threshold voltage distributions further comprises scaling the sum.

6. The method of claim 5, wherein scaling the sum comprises dividing the sum by the number of the plurality of threshold voltage distributions.

7. The method of claim 4, wherein the sum is a weighted sum.

8. The method of claim 1, further comprising reading the selected memory cells using the read voltages.

9. The method of claim 1, wherein the nonvolatile memory device is a flash memory device.

10. The method of claim 9, wherein the flash memory device comprises memory cells storing four bits per cell.

11. A memory system, comprising:
   a nonvolatile memory device comprising a plurality of memory cells arranged in respective connection with one of a plurality of word lines; and
   a memory controller that identifies a selected word line from among the plurality of word lines, wherein word lines other than the selected word line are unselected word lines, measures a plurality of threshold voltage distributions for memory cells respectively connected to at least one of the unselected word lines, combines the plurality of threshold voltage distribution to generate a collective threshold voltage distribution, detects local minimum points in the collective threshold voltage distribution, and identifies read voltages for selected memory cells respectively connected to the selected word line based on the local minimum points.

12. The memory system of claim 11, wherein the memory controller comprises a distribution information accumulator that stores at least one of the plurality of threshold voltage distributions.

13. The memory system of claim 11, wherein the memory controller comprises a filter that combines the plurality of threshold voltage distributions.

14. The memory system of claim 13, wherein the filter is a finite impulse response filter that combines the plurality of threshold voltage distributions using a weighted sum.

15. The method of claim 7, wherein each threshold voltage distribution among the plurality of threshold voltage distributions is weighed in the weighted sum according to a distance between the selected word line and the unselected word line associated with the threshold voltage distribution.

16. The memory system of claim 14, wherein each threshold voltage distribution among the plurality of threshold voltage distributions is weighed in the weighted sum according to a distance between the selected word line and the unselected word line associated with the threshold voltage distribution.

* * * * *